(12) United States Patent
Xiong

(10) Patent No.: US 7,952,420 B2
(45) Date of Patent: May 31, 2011

(54) COUNTING APPARATUS

(75) Inventor: Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/629,889

(22) Filed: Dec. 3, 2009

(65) Prior Publication Data

US 2011/0058639 A1    Mar. 10, 2011

(51) Int. Cl.
*H03K 17/687* (2006.01)

(52) U.S. Cl. ........................ 327/427; 327/603

(58) Field of Classification Search .................. 327/16, 327/603, 427, 432, 433
See application file for complete search history.

(56) References Cited

U.S. PATENT DOCUMENTS

| 6,788,128 | B2 * | 9/2004 | Tsuchida | 327/427 |
| 7,710,188 | B1 * | 5/2010 | An et al. | 327/427 |

\* cited by examiner

*Primary Examiner* — Hai L Nguyen
(74) *Attorney, Agent, or Firm* — Zhigang Ma

(57) ABSTRACT

A counting apparatus includes a sampling circuit, and a counting and displaying circuit. The sampling circuit includes an interface, a first electric switch, and a second electric switch. The counting and displaying circuit includes a counter and a display tube. Seven input terminals of the display tube are connected to seven output terminals of the counter correspondingly. A clock-up counting terminal of the counter is connected to the second terminal of the second electric switch.

18 Claims, 3 Drawing Sheets

COUNTING APPARATUS

BACKGROUND

1. Technical Field

The present disclosure relates to a counting apparatus.

2. Description of Related Art

Computer reliability tests include power cycling. In power cycling, a power-on period, a power-off period, and a cycling time of an Alternating Current (AC) power supply are set. The AC power supply is used to supply power to computers being tested to determine if they are reliable by counting the number of times they have successfully powered up. The number of times the computers have successfully powered up is counted by software in the computers. However, the software may not work if the computer breaks down.

DETAILED DESCRIPTION

Figure 1:
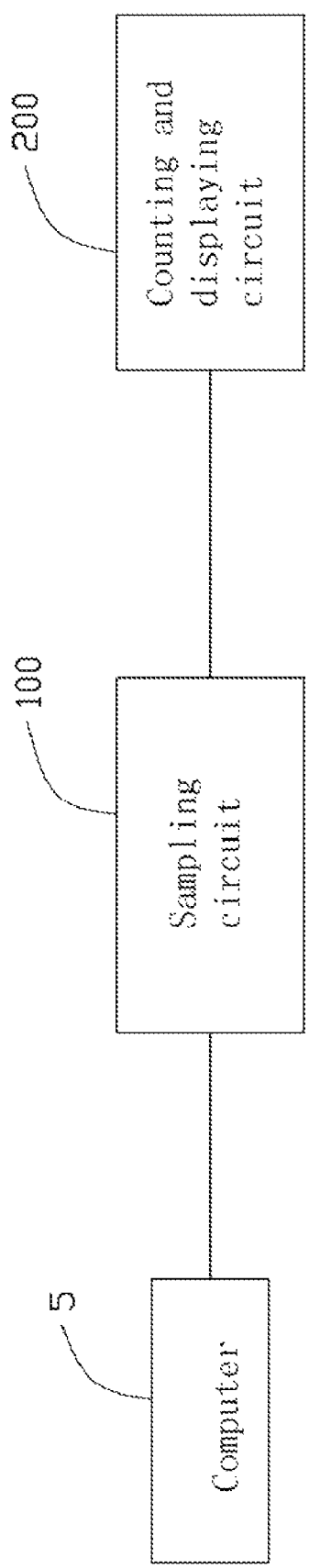
FIG. 1 is a block diagram of an exemplary embodiment of a counting apparatus.

Referring to FIG. 1, an exemplary embodiment of a counting apparatus includes a sampling circuit 100 and a counting and displaying circuit 200. The counting apparatus counts the number of times a computer 5 successfully powers up.

Figure 2:
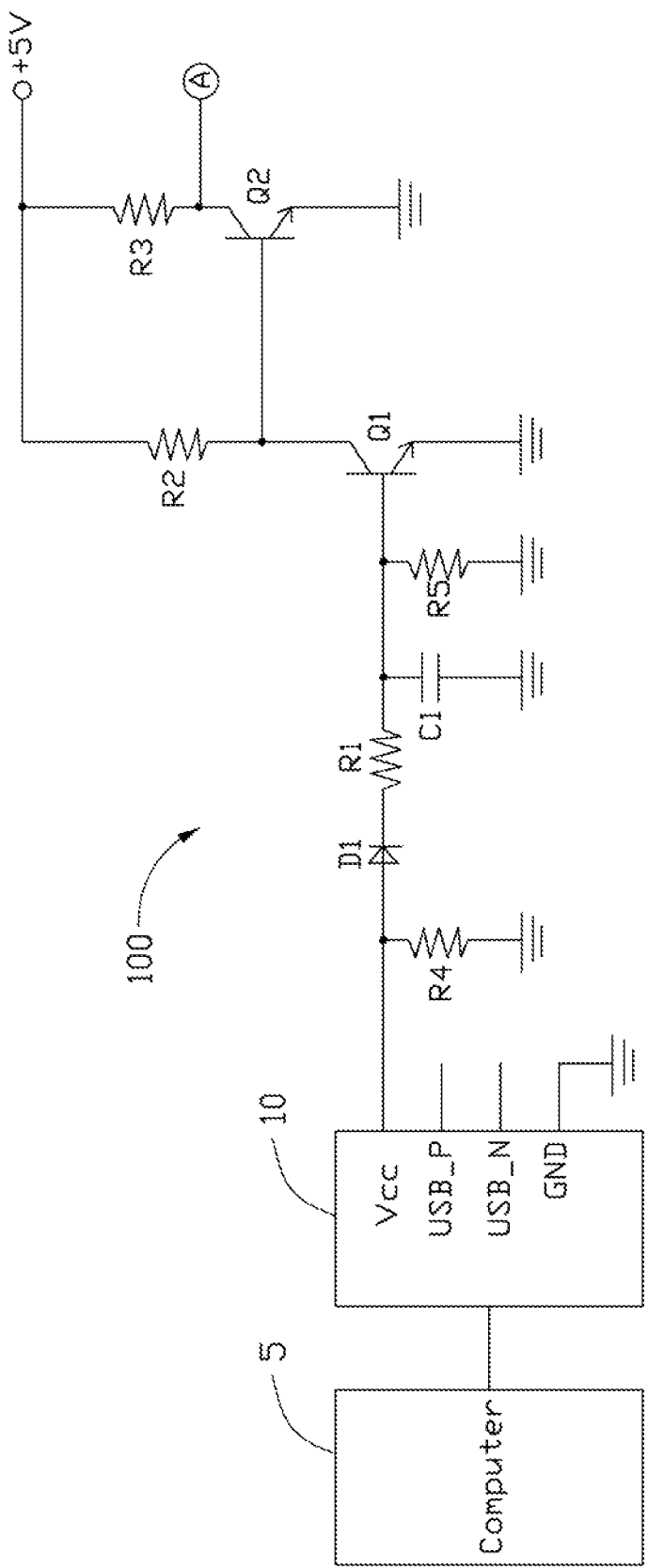
FIG. 2 is a circuit diagram of an exemplary embodiment of a sampling circuit of the counting apparatus of FIG. 1.

Referring to FIG. 2, the sampling circuit 100 includes an interface 10, a first electric switch Q1, a second electric switch Q2, a diode D1, a capacitor C1, and five resistors R1-R5. In one embodiment, the interface 10 is a universal serial bus (USB) interface.

The interface 10 is connected to a computer interface of the computer 5. The interface 10 includes a power terminal Vcc, a ground terminal GND, and two signal terminals USB_P and USB_N. The two signal terminals USB_P and USB_N are suspended. The ground terminal GND is grounded.

In one embodiment, the first electric switch Q1 and the second electric switch Q2 are both npn transistors. A base of the transistor Q1 is connected to a cathode of the diode D1 via the resistor R1, an anode of the diode D1 is connected to the power terminal Vcc of the interface 10. A collector of the transistor Q1 is connected to a +5 volt (V) power supply via the resistor R2. An emitter of the transistor Q1 is grounded. A base of the transistor Q2 is connected to the collector of the transistor Q1. A collector of the transistor Q2 is connected to the +5V power supply via the resistor R3. An emitter of the transistor Q2 is grounded.

The anode of the diode D1 is grounded via the resistor R4. The base of the transistor Q1 is grounded via the resistor R5 and the capacitor C1, which are connected in parallel to each other. At the moment the computer 5 powers up, power supplied to the computer 5 may be unstable. To prevent mistakes in counting caused by voltage spikes during power-up, the diode D1 is chosen with characteristics that only allow voltage above a threshold value through to be counted as a successful power-up. The resistors R4 and R5 are used to discharge the capacitor C1 and the computer 5, before the computer 5 powers up, to prevent interference voltage on the computer 5 by remaining electric charges.

Figure 3:
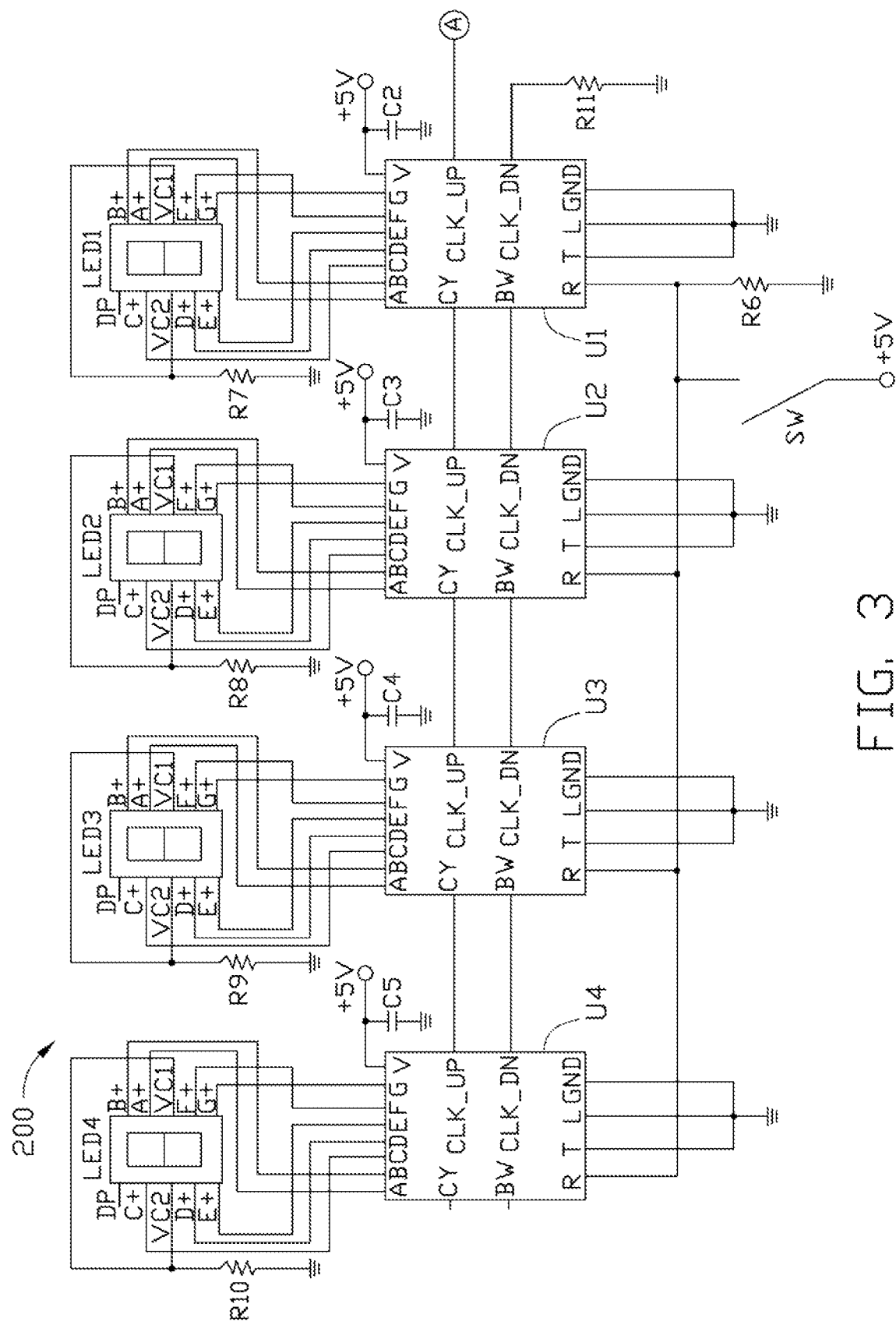
FIG. 3 is a circuit diagram of an exemplary embodiment of a counting and displaying circuit of the counting apparatus of FIG. 1.

Referring to FIG. 3, the counting and displaying circuit 200 includes four counters U1, U2, U3, and U4, four capacitors C2-C5, six resistors R6-R11, a switch SW, and four display tubes LED1, LED2, LED3, and LED4.

Each of the four counters U1~U4 includes a power terminal V, a ground terminal GND, an enable terminal T, a latch terminal L, a reset terminal R, a clock-up counting terminal CLK_UP, a clock-down counting terminal CLK_DN, a carry terminal CY, a borrow terminal BW, and seven output terminals A~G. The power terminals V of the four counters U1~U4 are connected to the +5V power supply, and grounded via the capacitors C2, C3, C4 and C5, respectively. The ground terminals GND, enable terminals T, and latch terminals L of the four counters U1~U4 are grounded. The reset terminals R of the four counters U1~U4 are grounded via the resistor R6. The reset terminals R of the four counters U1~U4 are also connected to the +5V power supply via the switch SW.

Each of the four display tubes LED1~LED4 includes two common terminals VC1 and VC2, seven input terminals A+, B+, C+, D+, E+, F+, G+, and a decimal point input terminal DP. The common terminal VC1 is connected to the common terminal VC2 and grounded via a corresponding one of the resistors R7-R10. The decimal point input terminal DP is suspended.

The input terminals A+~G+ of each of the four display tubes LED1~LED4 are connected to the output terminals A~G of a corresponding one of the four counters U1~U4, respectively.

The clock-up counting terminal CLK_UP of the counter U1 is connected to the collector of the transistor Q2. The clock-down counting terminal CLK_DN of the counter U1 is grounded via a resistor R11. The carry terminal CY of the counter U1 is connected to the clock-up counting terminal CLK_UP of the counter U2. The borrow terminal BW of the counter U1 is connected to the clock-down counting terminal CLK_DN of the counter U2. The carry terminal CY of the counter U2 is connected to the clock-up counting terminal CLK_UP of the counter U3. The borrow terminal BW of the counter U2 is connected to the clock-down counting terminal CLK_DN of the counter U3. The carry terminal CY of the counter U3 is connected to the clock-up counting terminal CLK_UP of the counter U4. The borrow terminal BW of the counter U3 is connected to the clock-down counting terminal CLK_DN of the counter U4. The carry terminal CY and the borrow terminal BW of the counter U4 are suspended.

The counters U1, U2, U3, and U4 are CD40110B counters. A truth table for each of the counters U1-U4 is shown as below:

| CLK_UP | CLK_DN | L | T | R | COUNTER | DISPLAY |
| --- | --- | --- | --- | --- | --- | --- |
| ↑ | X | 0 | 0 | 0 | Add 1 | Following the counter |
| X | ↑ | 0 | 0 | 0 | Subtract 1 | Following the counter |
| ↓ | ↓ | X | X | 0 | No change | No change |
| X | X | 1 | X | 1 | Goes to 0 | Remains fixed |
| X | X | 0 | X | 1 | Goes to 0 | Following the counter |
| X | X | X | 1 | 0 | Inhibited | Non-indicating |
| ↑ | X | 1 | 0 | 0 | Add 1 | Remains fixed |
| X | ↑ | 1 | 0 | 0 | Subtract 1 | Remains fixed |

Where, the symbol "↑" refers to a rising edge. The symbol "↓" refers to a falling edge. The symbol "X" refers to any state. The symbol "1" refers to a high voltage state. The symbol "0" refers to a low voltage state.

In the embodiment, the counter works when the enable terminal T is at the low voltage state. The counter goes to 0 when the reset terminal R is at the high voltage state. The counter fixes output when the latch terminal L is at the high voltage state.

The voltage of the power terminal Vcc of the interface 10 is at a high level when the computer 5 powers up. The transistor Q1 is turned on. The voltage of the collector of the transistor Q1 is at a low level. The transistor Q2 is turned off. The collector of the transistor Q2 is at a high level. A rising edge appears at the clock-up counting terminal CLK_UP of the counter U1. The counter U1 adds 1 to its output. The display tube LED1 displays the output of the counter U1 correspondingly.

The voltage of the power terminal Vcc of the USB interface 10 is at a low level when the computer 5 is power-off. The transistor Q1 is turned off. The voltage of the collector of the transistor Q1 is at a high level. The transistor Q2 is turned on. The collector of the transistor Q2 is at a low level. A falling edge appears at the clock-up counting terminal CLK_UP of the counter U1. The counter U1 does not count. The display tube LED1 displays the former output of the counter U1.

When the number of power up times to be counted exceeds 10, then two of the counters U1, U2, U3, and U4 are used, 100, three are used, and a thousand, all four are used.

The reset terminals R of the counters U1, U2, U3, and U4 are at the high voltage state when the switch SW is pressed. The counters U1, U2, U3, and U4 go to 0. The display tubes LED1~LED4 show "0000".

The foregoing description of the exemplary embodiments of the disclosure has been presented only for the purposes of illustration and description and is not intended to be exhaustive or to limit the disclosure to the precise forms disclosed. Many modifications and variations are possible in light of the above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A counting apparatus, comprising:
a sampling circuit comprising an interface to connect a computer, a first electric switch, and a second electric switch, wherein a first terminal of the first electric switch is connected to a power terminal of the interface via a first resistor, a second terminal of the first electric switch is connected to a power supply via a second resistor, a third terminal of the first electric switch is grounded, a first terminal of the second electric switch is connected to the second terminal of the first electric switch, a second terminal of the second electric switch is connected to the power supply via a third resistor, a third terminal of the second electric switch is grounded; and
a counting and displaying circuit comprising a first counter and a first display tube, the first counter comprising an enable terminal, a latch terminal, a clock-up counting terminal, a clock-down counting terminal, and seven output terminals, the first display tube comprising seven input terminals, wherein the input terminals of the first display tube are connected to the output terminals of the first counter correspondingly, the clock-up counting terminal of the first counter is connected to the second terminal of the second electric switch, the clock-down counting terminal of the first counter is grounded via a fourth resistor, the enable terminal and latch terminal of the first counter are grounded.

2. The counting apparatus of claim 1, wherein the interface is a universal serial bus interface.

3. The counting apparatus of claim 1, wherein the sampling circuit further comprises a diode connected between the first resistor and the power terminal of the interface, a cathode of the diode is connected to the first resistor, an anode of the diode is connected to the power terminal of the interface.

4. The counting apparatus of claim 1, wherein the sampling circuit further comprises a fifth resistor, the power terminal of the interface is grounded via the fifth resistor.

5. The counting apparatus of claim 1, wherein the sampling circuit further comprises a fifth resistor, the first terminal of the first electric switch is grounded via the fifth resistor.

6. The counting apparatus of claim 1, wherein the sampling circuit further comprises a capacitor, the first terminal of the first electric switch is grounded via the capacitor.

7. The counting apparatus of claim 1, wherein the voltage of the power supply is +5 volt.

8. The counting apparatus of claim 1, wherein the first electric switch and the second electric switch are both npn transistors, the first terminals of the first and second electric switches are bases of the transistors, the second terminals of the first and second electric switches are collectors of the transistors, the third terminals of the first and second electric switches are emitters of the transistors.

9. The counting apparatus of claim 1, wherein the first counter further comprises a reset terminal, the reset terminal of the first counter is grounded via a fifth resistor, and connected to the power supply via a switch.

10. The counting apparatus of claim 1, wherein the first counter further comprises a carry terminal and a borrow terminal, the counting and displaying circuit further comprises a second counter and a second display tube, seven input terminals of the second display tube are connected to seven output terminals of the second counter correspondingly, the carry terminal of the first counter is connected to a clock-up counting terminal of the second counter, the borrow terminal of the first counter is connected to a clock-down counting terminal of the second counter.

11. The counting apparatus of claim 10, wherein the interface is a universal serial bus interface.

12. The counting apparatus of claim 11, wherein the sampling circuit further comprises a diode connected between the first resistor and the power terminal of the interface, a cathode of the diode is connected to the first resistor, an anode of the diode is connected to the power terminal of the interface.

13. The counting apparatus of claim 12, wherein the sampling circuit further comprises a fifth resistor, the power terminal of the interface is grounded via the fifth resistor.

14. The counting apparatus of claim 13, wherein the sampling circuit further comprises a sixth resistor, the first terminal of the first electric switch is grounded via the sixth resistor.

15. The counting apparatus of claim 14, wherein the sampling circuit further comprises a capacitor, the first terminal of the first electric switch is grounded via the capacitor.

16. The counting apparatus of claim 15, wherein the voltage of the power supply is +5 volt.

17. The counting apparatus of claim 16, wherein the first electric switch and the second electric switch are both npn transistors, the first terminals of the first and second electric switches are bases of the transistors, the second terminals of the first and second electric switches are collectors of the transistors, the third terminals of the first and second electric switches are emitters of the transistors.

18. The counting apparatus of claim 17, wherein the first counter further comprises a reset terminal, the reset terminal of the first counter is grounded via a seventh resistor, and connected to the power supply via a switch.

* * * * *